United States Patent [19]

Aslan

[11] Patent Number: 4,629,978

[45] Date of Patent: Dec. 16, 1986

[54] DIPOLE ANTENNA

[75] Inventor: Edward E. Aslan, Plainview, N.Y.

[73] Assignee: The Narda Microwave Corporation, Hauppauge, N.Y.

[21] Appl. No.: 667,323

[22] Filed: Nov. 1, 1984

[51] Int. Cl.⁴ ........................ G01R 5/22; G01R 21/02

[52] U.S. Cl. ...................................... 324/95; 324/106; 343/703

[58] Field of Search .................. 324/95, 106; 343/703; 340/600; 455/67

[56] References Cited

U.S. PATENT DOCUMENTS

| | | | |
|---|---|---|---|
| 3,641,439 | 2/1972 | Aslan | 324/106 X |
| 3,789,299 | 1/1974 | Aslan | 324/106 X |
| 3,794,914 | 2/1974 | Aslan | 324/106 X |
| 3,931,573 | 1/1976 | Hopfer | 324/106 |
| 4,518,912 | 5/1985 | Aslan | 324/106 X |

FOREIGN PATENT DOCUMENTS

| | | | |
|---|---|---|---|
| 2133895 | 8/1984 | United Kingdom | 324/95 |

OTHER PUBLICATIONS

Bassen, H., "Electric Field Probes—A Review", IEEE Trans. on Antennas & Propagation, vol. AP-31, No. 5, Sep. 1983, pp. 710–718.

*Primary Examiner*—Reinhard J. Eisenzopf
*Assistant Examiner*—Stephen M. Baker
*Attorney, Agent, or Firm*—Eisenman, Allsopp & Strack

[57] ABSTRACT

An antenna comprising orthogonal arrays of resistive thermocouple dipoles interconnected by transversely extending conductive elements of discrete length. The components are designed to create an additional response by a traveling wave effect on the dipoles along the Poynting vector to offset the fall-off in dipole sensitivity experienced as frequency rises.

8 Claims, 9 Drawing Figures

DIPOLE ANTENNA

BACKGROUND OF THE INVENTION

1. Field of the Invention

This invention relates to dipole antennas and more particularly, to the improvement of resistive dipole antennas in order to increase the frequency response range.

2. Description of the Prior Art

U.S. Pat. Nos. 3,641,439 and 3,794,914, issued to Edward E. Aslan on Feb. 9, 1972 and Feb. 26, 1974 respectively, disclose instruments for the detection and measurement of microwave radiation over a range of frequencies. These instruments utilize three orthogonally disposed dipoles to produce a relatively broadband isotropic response. In addition, applicant's copending U.S. patent application Ser. Nos. 6,451,041 and 6,451,040, each filed Dec. 20, 1982, disclose unique radiation hazard meters which also use resistive dipole antennas to monitor radiation and display the potential hazard that radiation fields may constitute.

The dipole antennas of such instruments exhibit limitations to the bandwidth of their response as frequency increases. This is because the reactance of the dipole increases with increasing frequency, until it is larger than the resistance, causing a reduction in the antenna sensitivity.

The aforementioned patent applications are concerned with expanding the frequency range of detection instruments and employ both thermocouple and diode sensors in structural arrangements to achieve a broadband response, however, these units do not overcome the bandwidth limitations which are inherent in all known dipole antenna configurations.

SUMMARY OF THE INVENTION

The present invention utilizes a specific structural arrangement of dipole antenna elements to create an additional response produced by a traveling wave effect on the dipoles oriented along the Poynting vector. This additional response is made available to offset the decreased sensitivity of the dipole as the frequency rises.

An object of the invention is to provide an improved resistive dipole antenna structure.

Another object of the invention is to provide an improved resistive dipole antenna arrangement providing a broadband isotropic response.

Another object of the invention is to provide an improved resistive dipole antenna structure having relatively constant sensitivity across a broadband of frequencies.

According to one aspect of the invention, there is provided an antenna responsive to a particular range of frequencies. Three mutually orthogonal antenna assemblies each include an array of resistive thermocouples extending along a substantially longitudinal axis. Within each assembly, conductive elements of discrete length extend transverse to their respective array and are connected between each resistive thermocouple. The spacing between the conductive elements is approximately one-half wavelength of the mid-frequency of the range for which the antenna is designed.

According to another aspect of the invention, three sets of antenna assemblies of the type described in the preceding paragraph are mounted, with each being longitudinally aligned upon a different one of three orthogonally disposed axes.

The invention will be more thoroughly understood and appreciated from the following description which is made in conjunction with the drawings.

DESCRIPTION OF THE PREFERRED EMBODIMENT

Figure 1A:
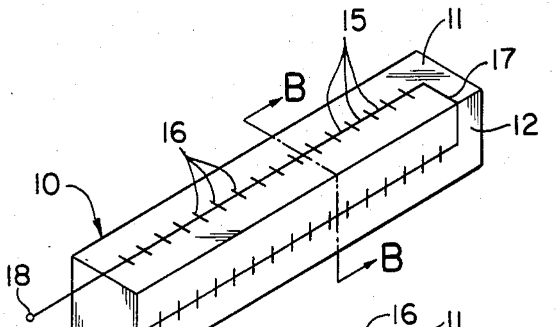
FIGS. 1A and 1B illustrate a resistive dipole array embodying the features of the invention.
Figure 1B:
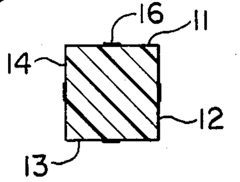

This invention requires a particular orientation of the antenna's sensor and conductive elements to develop the additional response produced by a traveling wave effect as the sensitivity of the dipoles falls off with increasing frequency. In a particular embodiment, the sensor elements are resistive thermocouples and these are interposed between conductive elements of discrete length. FIGS. 1A and 1B illustrate the structure of one dipole antenna assembly. FIG. 1B is a cross-section through the structure of FIG. 1A, along line B—B.

Since the thermocouple and conductive components are inherently structurally weak, they are mounted upon an appropriate substrate 10 such as Styrofoam. Substrate 10 has a square cross-section, as seen in FIG. 1B, with faces 11, 12, 13, and 14. On each face, e.g. 11, an array of resistive thermocouples 15 is arranged along a longitudinal axis; each thermocouple being disposed between conductive elements 16 of discrete length arranged transverse to the axis of the array. The arrays of thermocouples on adjacent faces, e.g. 11 and 12, are connected at one end by a conductive element 17. The length of the conductive elements connected between the thermocouples determines the amplitude of the current induced therein and the spacing between these elements determines the phase difference of the currents in adjacent elements. By placing two elements at right angles, one eliminates a polarization ellipse which would otherwise be present as a result of the angle between the electric field vector and the short length of the element.

Figure 2A:
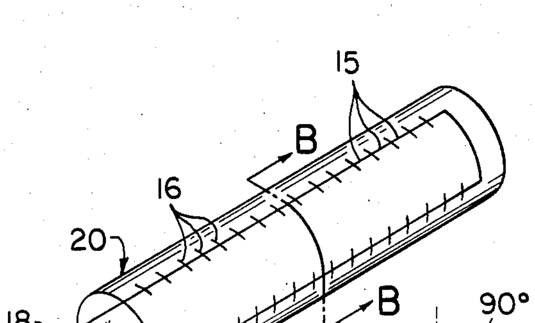
FIG. 2 illustrates a second resistive dipole array embodying the features of the invention.
Figure 2B:
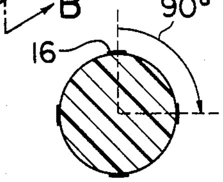

It is essential that the short conductive elements be disposed orthogonally with respect to one another. FIGS. 2A and 2B illustrate that this condition can also be achieved by use of a cylindrical substrate 20. The elements on these figures bear numerical designations similar to those used in FIGS. 1A and 1B. Rather than having the thermocouple arrays arranged along perpendicular faces of a mounting block, FIG. 2A shows that they can be arranged along axes disposed 90 degrees from one another along the surface of the cylindrical substrate 20. Each thermocouple element is symmetrically arranged about a particular longitudinal axis and consequently the incremental portions of the thermocouples and interposed conductive strips will always be orthogonal to a corresponding incremental portion of their counterpart in an adjacent axis.

Figure 3:
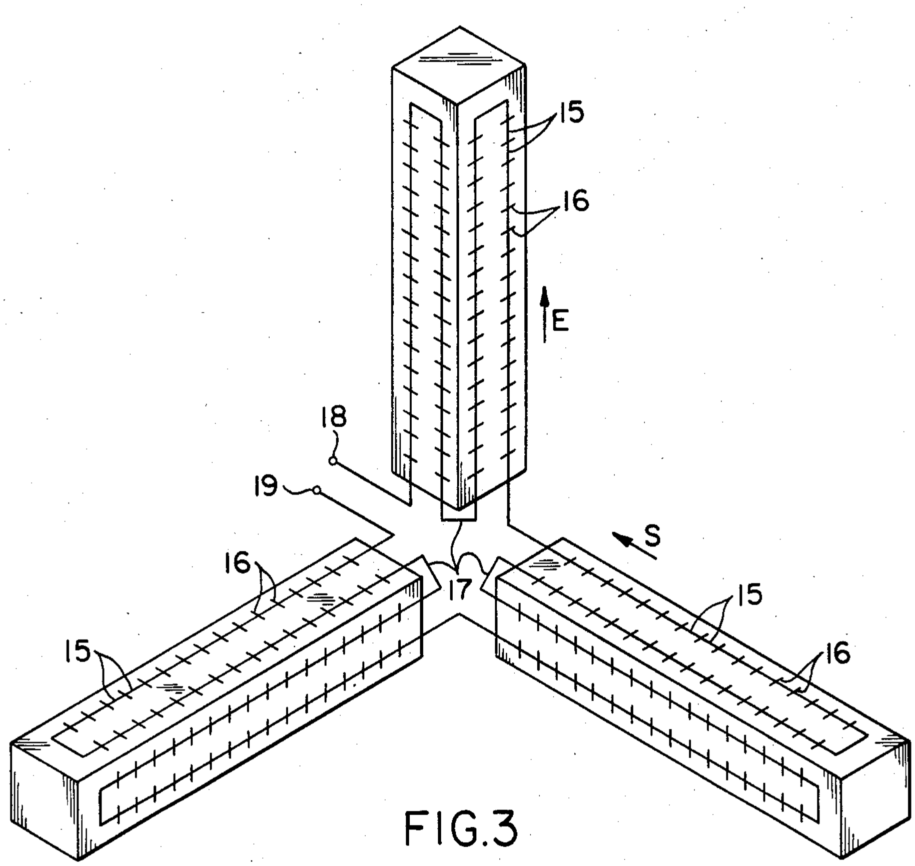
FIG. 3 illustrates a further embodiment of the invention, utilizing three antenna arrays disposed along mutually orthogonal axes.

FIG. 3 shows the arrangement of three antenna assemblies spacially disposed in turn along mutually orthogonal axes. In addition, it illustrates that each face of a substrate may have the thermocouple arrays "folded-over" for wiring convenience. When arranged as shown in FIG. 3, there is complete isotropic performance of the antenna unit. It should be recognized that the essence of this spacial arrangement lies in the orthogonality of the axes of the three basic components. These axes need not converge toward a common center and the components need not be disposed in any specific degree of proximity to one another.

In general, it should be understood that the broadband characteristics sought by this invention are obtained by distributing resistive thermocouple dipoles along the length of an element at spacings that will permit no resonant lengths over the range of frequencies within which the probe is intended to operate as a linear resistive dipole. The spacing between thermocouples is less than one-quarter wavelength of the highest frequency of this operable mode. The probe may be viewed as a group of series-connected small resistive dipoles or as a very low Q resonant circuit.

When a microwave field impinges upon the antenna array of FIGS. 1A or 2A (or the components in FIG. 3), an output is produced between terminals 18,19. More particularly, when the antenna is exposed to an electromagnetic field, potential differences are generated across the resistive thermocouple 15, causing currents to flow therein. To provide a uniform response to the traveling wave, as elements are rotated in a plane normal to the Poynting vector, the two arrays are placed at right angles to each other. Each dipole 15 behaves as a linear dipole when positioned tangential to the electric field. On the other hand, when positioned perpendicular to the electric field, along the Poynting vector, a dipole 15 exhibits the characteristics of a traveling wave antenna with increased output as the frequency increases, thereby compensating for the usual reduction in sensitivity created by the increase in the reactance of the dipole.

Figure 4A:
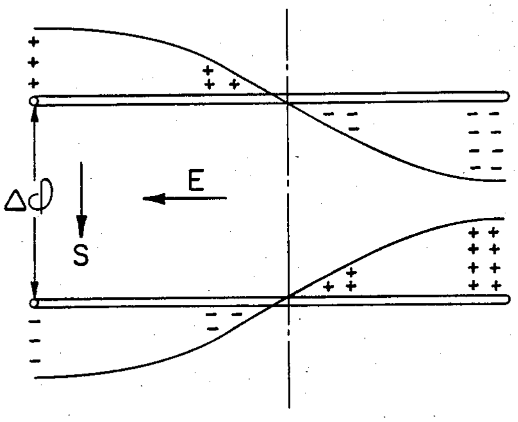
FIGS. 4A and 4B illustrate an instantaneous charge distribution and potential across thermocouples of the type employed in this invention.
Figure 4B:
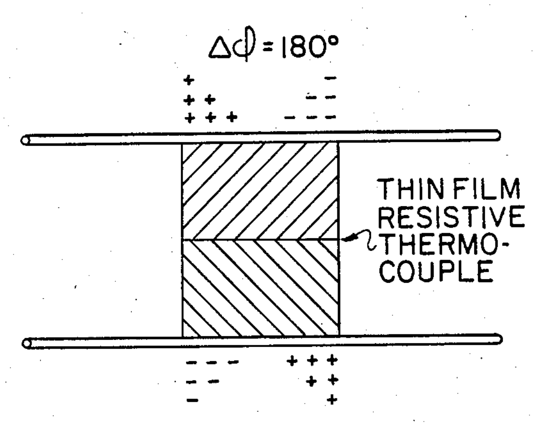
Figure 5:
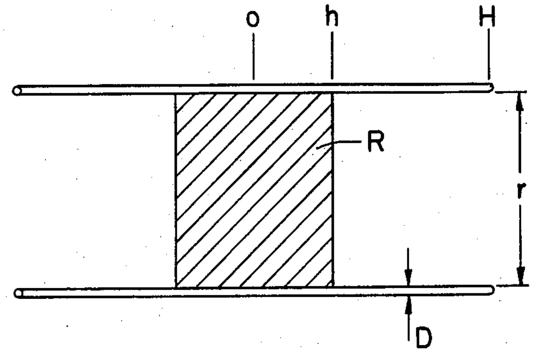
FIG. 5 is a schematic illustration used in conjunction with the following text for describing the potential across a resistive section of dipole antenna.

FIGS. 4A and 4B illustrate the instantaneous charge distribution which causes current to flow in a resistive thin film thermocouple when the total array is aligned along the Poynting vector. An analytical analysis can be made of the two adjacent elements shown in FIG. 5. Due to the symmetry, only one side of FIG. 5 need be analyzed for an explanation of the performance.

The open circuit voltage $V_{oc}$ is determined from the integral:

$$V_{oc} = \int_{o}^{H} \frac{E\sin\beta(H-h)}{\sin\beta H}\left[e^{j\omega t} - e^{j(\omega t - \beta r)}\right] dh \qquad \text{I}$$

where E equals electric field strength, $\omega = 2\pi f$, $\beta = \omega/c$, and c equals the speed of light. This reduces to $$V_{oc} = Ej\omega t(1 - e^{-j\beta r}) \int_{o}^{H} \frac{\sin\beta(H-h)}{\sin\beta H} dh \qquad \text{II}$$

In equation II, the term to the left of the integral constitutes the contribution due to the retarded field effect or the phase delay of the induced voltage. The integral constitutes the magnitude of the induced voltage for a sinusoid current distribution. $V_{oc}/E$ is the effective length of a dipole pair:

$$V_{oc}/E = \frac{E(1-\cos\beta r)}{\beta\sin\beta H}\left[\cos\beta(H-h) - \cos\beta H\right]_{o}^{H} \qquad \text{III}$$

$$V_{oc}/E = \frac{\lambda(1-\cos\beta r)}{\pi\sin\beta H}(1 - \cos\beta H) \qquad \text{IV}$$

An equivalent circuit may be evolved from a transmission line analysis of a pair of adjacent elements. The resistive thermocouple is seen from FIG. 5 to terminate two open circuited transmission lines. The characteristic impedance of such a line is $R_o = 276 \log r/D$. For the dimensions used in a particular embodiment of the invention, $R_o$ was equal to 214 ohms. The open circuit impedance of one-half of the line appearing across the thermocouple is $$Z_{oc} = -jR \cot \frac{2\pi H}{\lambda}$$

The total impedance across the thermocouple, i.e., both halves of the line in parallel, $X_c = Z_{oc}/2$.

For this particular geometry $$X_c = -j107 \cot \frac{2\pi H}{\lambda} \qquad \text{V}$$

Therefore, the lumped equivalent capacitance is:

$$C_a = \frac{\lambda}{\left[2\pi c\, 138 \log \frac{r-D}{D}\right] \cot \frac{2\pi H}{\lambda}} \qquad \text{VI}$$

The transmission line inductance is:

$$L_a = 4 \times 10^{-7}\left(\ln \frac{r-D}{D}\right) 2H \qquad \text{VII}$$

Figure 6:
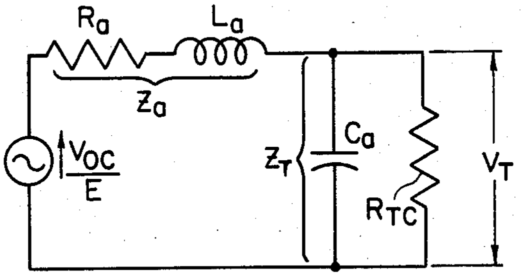
FIG. 6 is the lumped equivalent circuit for the thermocouple dipole.

The lumped circuit is shown in FIG. 6. The radiation resistance of both dipoles for a sinusoidal current distribution is:

$$R_a = \frac{160\pi^2 H^2}{\lambda^2} \qquad \text{VIII}$$

The direct-current output of the thermocouple is proportional to the square of the radio frequency voltage developed across the thermocouple.

Circuit values for a particular embodiment of the invention were: $C_a = 0.033$ pfds; $R_a$ varies from 2 to 17 ohms within 12–40 GHz. range; $L_a = 1.14 \times 10^{-9}$ henrys; and $R_{TC} = 140$ ohms.

$V_T^2$ and the resultant direct-current output of the thermocouple can be seen to increase with frequency commencing at 12 GHz. and then remain fairly constant from 18 to 40 GHz. This output is proportionally increased with the number of thermocouple junctions used. The total output complements the output from the element when functioning as a resistive linear dipole in the lower frequency region, producing an extremely broadband sensor.

Several particular resistive dipole antenna structures have been described. It will be appreciated that modifications will become apparent to those skilled in the art.

All modifications coming within the teachings of this disclosure are intended to be covered by the following claims.

I claim:

1. An antenna responsive to a particular range of frequencies, comprising mutually orthogonal antenna assemblies, each including an array of resistive thermocouples extending along a substantially longitudinal axis, a conductive element of discrete length connected between each of said thermocouples and extending transverse to the respective array, the spacing between said conductive elements being approximately one-half wavelength at the mid-frequency of said particular range of frequencies.

2. An antenna as defined in claim 1, comprising three sets of said mutually orthogonal antenna assemblies, each of said sets being aligned along one of three mutually orthogonal axes.

3. An antenna as defined in claim 1, wherein said thermocouples and said conductive elements are mounted upon a substrate having a square cross-section.

4. An antenna as defined in claim 1, wherein said thermocouples and said conductive elements are mounted upon a substrate having a circular cross-section.

5. An antenna responsive to a particular range of frequencies, comprising mutually orthogonal antenna assemblies, each including a pair of arrays of resistive thermocouples, the thermocouples of each of said arrays extending along a substantially longitudinal axis, and the arrays of each said pair lying along parallel axes, conductive means interconnecting the arrays of each said pair at one end, a conductive element of discrete length connected between each of said thermocouples and extending transverse to the respective array, the spacing between the conductive elements being approximately one-half wavelength at the mid-frequency of said particular range of frequencies.

6. An antenna as defined in claim 5, comprising three sets of said mutually orthogonal antenna assemblies, each of said sets being aligned along one of three mutually orthogonal axes.

7. An antenna as defined in claim 5, wherein said thermocouples and said conductive elements are mounted upon a substrate having a square cross-section.

8. An antenna as defined in claim 5, wherein said thermocouples and said conductive elements are mounted upon a substrate having a circular cross-section.

* * * * *